United States Patent
Birtcher et al.

(10) Patent No.: US 6,648,034 B1
(45) Date of Patent: Nov. 18, 2003

(54) PURGEABLE MANIFOLD FOR LOW VAPOR PRESSURE CHEMICALS CONTAINERS

(75) Inventors: Charles Michael Birtcher, Valley Center, CA (US); Martin Castaneda Martinez, Oceanside, CA (US); Thomas Andrew Steidl, Escondido, CA (US); Gil Vivanco, San Diego, CA (US); David James Silva, San Diego, CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 10/155,726

(22) Filed: May 23, 2002

(51) Int. Cl.[7] .............................................. F17C 13/00
(52) U.S. Cl. ......................... 141/302; 141/21; 141/47; 141/63; 141/302; 137/209; 137/606
(58) Field of Search ............................... 141/18, 21, 65, 141/67, 63, 47–50, 302; 137/206, 209, 238, 240, 606

(56) References Cited

U.S. PATENT DOCUMENTS

| | | | |
|---|---|---|---|
| 3,958,720 A | 5/1976 | Anderson | 221/93 |
| 4,357,175 A | 11/1982 | Buffington et al. | 134/10 |
| 4,537,660 A | 8/1985 | McCord | 202/170 |
| 4,570,799 A | 2/1986 | Mednis | 206/509 |
| 4,832,753 A | 5/1989 | Cherry et al. | 134/22.18 |
| 4,865,061 A | 9/1989 | Fowler et al. | 134/108 |
| 4,871,416 A | 10/1989 | Fukuda | |
| 5,051,135 A | 9/1991 | Tanaka et al. | 134/10 |
| 5,106,404 A | 4/1992 | Grant | 55/195 |
| 5,108,582 A | 4/1992 | Foutsitzis et al. | 208/138 |
| 5,115,576 A | 5/1992 | Roberson et al. | 34/15 |
| 5,148,945 A | * 9/1992 | Geatz | 222/1 |
| 5,240,507 A | 8/1993 | Gray et al. | 134/21 |
| 5,297,767 A | 3/1994 | Miller et al. | 248/311.2 |

(List continued on next page.)

FOREIGN PATENT DOCUMENTS

| | | | |
|---|---|---|---|
| JP | 8115886 | 5/1996 | H01L/21/205 |
| WO | 9964780 | 12/1999 | F17C/13/00 |

*Primary Examiner*—J. Casimer Jacyna
(74) *Attorney, Agent, or Firm*—Geoffrey L. Chase

(57) ABSTRACT

A manifold comprising a container having two ports; a conduit connecting the container to a source/dispense of chemical having a first end and a second end and a connector for the ends; first block valve having two diaphragm valves, each valve having a valve seat side and a diaphragm side, each valve seat side faces the other valve seat side, and connected to the first end of the conduit, one diaphragm side connected to a first port, and another diaphragm side connected to vent; a second block valve having two diaphragm valves, having a valve seat side and a diaphragm side, wherein each valve seat side faces the other valve seat side, and each valve seat side connected to the second end of the conduit, the diaphragm side of one valve connected to purge, and the diaphragm side of another valve connected to push gas or chemical outlet.

22 Claims, 6 Drawing Sheets

U.S. PATENT DOCUMENTS

| | | | | |
|---|---|---|---|---|
| 5,304,253 A | | 4/1994 | Grant | 134/26 |
| 5,339,844 A | | 8/1994 | Stanford, Jr. et al. | 134/107 |
| 5,398,846 A | | 3/1995 | Corba et al. | 222/1 |
| 5,409,141 A | | 4/1995 | Kikuchi et al. | 222/81 |
| 5,419,924 A | * | 5/1995 | Nagashima et al. | 427/248.1 |
| 5,425,183 A | | 6/1995 | Taylor | 34/73 |
| 5,465,766 A | | 11/1995 | Siegele et al. | 141/198 |
| 5,469,876 A | | 11/1995 | Gray et al. | 134/105 |
| 5,472,119 A | | 12/1995 | Park et al. | 222/145.8 |
| 5,509,431 A | | 4/1996 | Smith, Jr. et al. | 134/95.1 |
| 5,538,025 A | | 7/1996 | Gray et al. | 134/105 |
| 5,557,381 A | | 9/1996 | Sakamoto et al. | 355/260 |
| 5,562,132 A | | 10/1996 | Siegele et al. | 141/198 |
| 5,562,883 A | | 10/1996 | Salisbury et al. | 422/133 |
| 5,565,070 A | | 10/1996 | Doi et al. | 203/91 |
| 5,573,132 A | | 11/1996 | Kanfer et al. | 220/4.23 |
| 5,590,695 A | | 1/1997 | Siegele et al. | 141/21 |
| 5,601,107 A | * | 2/1997 | Moore et al. | 137/15.04 |
| 5,607,002 A | | 3/1997 | Siegele et al. | 141/198 |
| 5,704,965 A | * | 1/1998 | Tom et al. | 95/95 |
| 5,711,354 A | | 1/1998 | Siegele et al. | 141/198 |
| 5,803,599 A | * | 9/1998 | Ferri et al. | 366/134 |
| 5,878,793 A | | 3/1999 | Siegele et al. | 141/63 |
| 5,937,886 A | * | 8/1999 | Girard et al. | 137/3 |
| 5,964,230 A | | 10/1999 | Voloshin et al. | 134/98.1 |
| 5,964,254 A | | 10/1999 | Jackson | 141/21 |
| 6,077,356 A | | 6/2000 | Bouchard | 118/715 |
| 6,138,691 A | * | 10/2000 | Voloshin et al. | 134/22.11 |
| 6,161,875 A | | 12/2000 | Yamaji et al. | 285/24 |
| 6,267,132 B1 | * | 7/2001 | Guarneri | 137/14 |
| 6,431,229 B1 | * | 8/2002 | Birtcher et al. | 141/302 |

* cited by examiner

PURGEABLE MANIFOLD FOR LOW VAPOR PRESSURE CHEMICALS CONTAINERS

BACKGROUND OF THE INVENTION

The present invention relates to a low dead space easily cleaned manifold for detaching a container of a chemical delivery system, and in particular to an apparatus for delivering high-purity or ultra-high purity chemicals to a use point, such as a semiconductor fabrication facility or tool(s) for chemical deposition. Although the invention may have other applications, it is particularly applicable in semiconductor fabrication.

Semiconductor manufacturers require chemicals having at least a high-purity for production processes to avoid defects in the fabrication of semiconductor devices. The chemicals used in the fabrication of integrated circuits usually must have an ultra-high purity to allow satisfactory process yields. As integrated circuits have decreased in size, there has been an increase in the need to maintain the purity of source chemicals.

One ultra-high purity chemical used in the fabrication of integrated circuits is tetrakis(dimethylamido)titanium (TDMAT). TDMAT is used widely in integrated circuit manufacturing operations, such as chemical vapor deposition (CVD) to form titanium and titanium nitride films, vias and barrier layers.

Integrated circuit fabricators typically require TDMAT with 99.99+% purity, preferably 99.999999+%(8–9's+%) purity. This high degree of purity is necessary to maintain satisfactory process yields. It also necessitates the use of special equipment to contain and deliver the high-purity or ultra-high purity TDMAT to CVD reaction chambers.

High-purity chemicals and ultra-high purity chemicals, such as TDMAT, are delivered from a bulk chemical delivery system to a use point, such as a semiconductor fabrication facility or tool(s). A delivery system for high-purity chemicals is disclosed in U.S. Pat. No. 5,590,695 (Seigele, et al.) which uses two block valve assemblies 76 and 91, but not to facilitate rapid clean disconnection. (Related patents include U.S. Pat. Nos. 5,465,766; 5,562,132; 5,607,002; 5,711,354; 5,878,793 and 5,964,254.) The system comprises: a block valve assembly housing a low pressure vent valve and a carrier gas isolation valve, while the other block valve assembly houses a container bypass valve and a process isolation canister bypass valve. The block valve assemblies are not in series nor are they used for disconnect of a container from a manifold.

Solvent purging systems for removal of low vapor pressure chemicals from process conduits are disclosed in U.S. Pat. No. 5,964,230 and U.S. Pat. No. 6,138,691. Such systems may add additional complexity to purging and increase the amount of materials which must be disposed of.

Low dead space couplings are known, such as U.S. Pat. No. 6,161,875.

TDMAT is considered a low vapor pressure, high purity chemical by the semiconductor industry, and thus presents special problems when breaking a process line or changing out a process container where the line must be cleaned prior to such detachment. Significant time delays in cleaning down a line or conduit are a disadvantage in the throughput of a wafer processing facility, where expensive tools and large batch processing of expensive wafers, each containing hundreds of integrated circuits require fast processing and avoidance of significant or lengthy offline time for cleaning or changeout of process containers or vessels.

The Present Invention is more specifically directed to the field of process chemical delivery in the electronics industry and other applications requiring low vapor pressure, high purity chemical delivery. More specifically, the present invention is directed to apparatus for the cleaning of process chemical delivery lines, containers and associated apparatus, particularly during changeout of process chemical or process chemical containers in such process chemical delivery lines, quickly and thoroughly, when processing with low vapor pressure, high purity chemicals.

Evacuation and gas purge of process chemical lines have been used to remove residual chemicals from delivery lines. Both vacuum draw and inert gas purge are successful in quickly removing high volatility chemicals, but are not effective with low volatility chemicals. Safety is a problem when extracting highly toxic materials.

Use of solvents to remove residual chemicals has been suggested to remove low vapor pressure chemicals from process lines when the lines need to be disconnected such as for replacement of a vessel or container for either refill or maintenance. However, solvent systems can be complex and require a source of solvent and a means to handle the contaminated solvent after it has been used for its cleaning function.

The present invention overcomes the drawbacks of the prior art in purging and cleaning chemical process lines for low vapor pressure chemicals without the requirements of lengthy purge cycles of pressurized gas and vacuum, as will be more fully set forth below.

BRIEF SUMMARY OF THE INVENTION

The present invention is a purgeable manifold for transfer of low vapor pressure, high purity chemicals in a high purity chemical delivery system, comprising:

(a) a first container for containing a quantity of the low vapor pressure, high purity chemical having at least two ports capable of receiving or dispensing the low vapor pressure, high purity chemical;

(b) a first conduit for detachably connecting the first container to a point of source or dispense of the low vapor pressure, high purity chemical, the first conduit having a first end and a second end and a first low dead space connector for detaching the first end of the first conduit from the second end of the first conduit;

(c) a first block diaphragm valve assembly having first and second diaphragm valves, each diaphragm valve having a diaphragm and having a valve seat side and a diaphragm side, wherein the valve seat side of each diaphragm valve is juxtaposed to the other valve seat side of the other diaphragm valve, and each valve seat side of each diaphragm valve having low vapor pressure, high purity chemical flow communication with the first end of the first conduit, and the diaphragm side of the first diaphragm valve having flow communication with a first of the at least two ports, and the diaphragm side of the second diaphragm valve having flow communication with a conduit capable of a function selected from the group consisting of a source of push gas and a source of vent;

(d) a second block diaphragm valve assembly having third and fourth diaphragm valves, each diaphragm valve having a diaphragm and having a valve seat side and a diaphragm side, wherein the valve seat side of each diaphragm valve is juxtaposed to the other valve seat side of the other diaphragm valve, and each valve seat side of each diaphragm valve having flow communication with the second end of the first conduit, and the diaphragm side of the third diaphragm valve having flow communication with a conduit capable of a function selected from the group consisting of a source of purge gas and vacuum, and the diaphragm side of the fourth diaphragm valve having flow communication with a conduit capable of a function selected from the group consisting of a source of push gas, a source of bubbling gas and a dispense for low vapor pressure, high purity chemical; and (e) the second port having flow communication with the first container and capable of a function selected from the group consisting of delivering push gas to the first container and dispensing low vapor pressure, high purity chemical in a push gas from the first container.

DETAILED DESCRIPTION OF THE INVENTION

Figure 1:
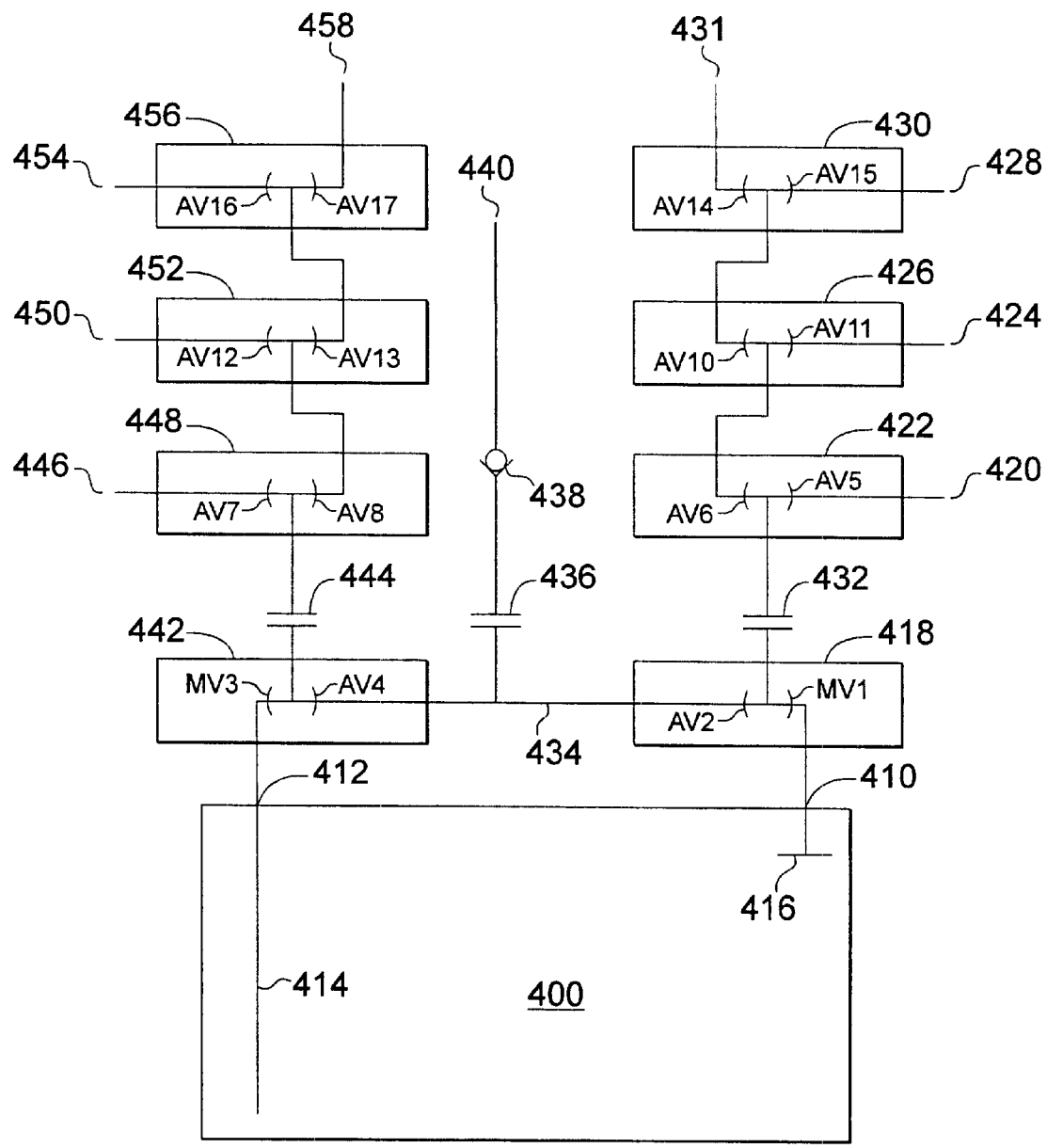
FIG. 1 is a schematic of a first embodiment of the present invention having several sets of block diaphragm valve assemblies on the inlet and outlet port of a container.

The present invention provides a readily cleanable and purgeable manifold for dispensing or delivery of low vapor pressure, high purity chemical to or from a process container, which in turn dispenses the chemical to a process tool or reactor for consumption. The apparatus of the present invention is particularly suited for process chemicals used in the semiconductor industry.

Although the apparatus of the present invention is applicable to low vapor pressure chemicals, such as tetrakis (dimethylamido)titanium, it is also applicable to chemicals which do not have a low vapor pressure, i.e., high vapor pressure chemicals, and thus can be used with a wide array of chemicals.

The manifold and chemical delivery system of the present invention may be used in various applications with various fluids, but has particular application for liquid chemicals that have at least a high purity. For example, the liquid chemical may be selected from the group consisting of tetraethylorthosilicate (TEOS), borazine, aluminum trisec-butoxide, carbon tetrachloride, trichloroethanes, chloroform, trimethylphosphite, dichloroethylenes, trimethylborate, dichloromethane, titanium n-butoxide, diethylsilane, hexafluoroacetylacetonato-copper(1)trimethylvinylsilane, isopropoxide, triethylphoshate, silicon tetrachloride, tantalum ethoxide, tetrakis(diethylamido)titanium (TDEAT), tetrakis(dimethylamido)titanium (TDMAT), bis-tertiarybutylamido silane, triethylborate, titanium tetrachloride, trimethylphosphate, trimethylorthosilicate, titanium ethoxide, tetramethyl-cyclo-tetrasiloxane, titanium n-propoxide, tris(trimethylsiloxy)boron, titanium isobutoxide, tris(trimethylsilyl)phosphate, 1,1,1,5,5,5-hexafluoro-2,4-pentanedione, tetramethylsilane and mixtures thereof.

The purgeable manifold for a chemical delivery system of the present invention will now be described with regard to a particular embodiment processing TDMAT as the low vapor pressure, high purity chemical delivered from the process container and then to a process tool of a semiconductor fab.

In a bubbler, the liquid chemical is entrained in a pressurized gas, bubbler gas or carrier gas that is bubbled into the liquid chemical, as it resides in the process container, through a diptube which introduces the pressurized gas into the liquid chemical below the surface of the chemical. The pressurized gas entrains or vaporizes some of the chemical and the vapor leaves with the pressurized gas through an outlet communicating with the process tool.

Chemical delivery can also be accomplished by vapor draw, where a vacuum is applied to the outlet of the process container to induce the chemical to vaporize and leave via the outlet under vacuum conditions. This vapor draw can be accomplished with or without positive gas pressure assist from push gas directed into the process container from the inlet.

It is also possible to use the present invention in a liquid delivery to the process tool where the process container delivers liquid chemical out a diptube to the process tool by the action of pressurization gas or push gas on the headspace or liquid surface of the chemical in the process vessel (direct liquid injection or DLI).

Pressurizing gas can be any inert gas, such as nitrogen, argon, helium or the rare noble gases.

Purge gas is used to clean process conduits or lines when such conduits are off-line and subject to cleaning or removal of residual chemical.

With reference to FIG. 1, a high purity chemical delivery system illustrates the use of a low dead space and minimized wetted surface area apparatus of the present invention. The block diaphragm valve assemblies of FIG. 1 have the same structure as detailed in FIGS. 2a and b and the same low dead space connections as detailed in FIG. 3. Container 400 can be used as either a liquid out chemical delivery system with chemical removed through diptube 414, through block diaphragm valve assembly 442, first conduit containing low dead space connector 444, second block diaphragm valve assembly 448 and chemical dispense conduit 446; or, alternatively, a push or bubbling gas can be administered through conduit 446, through block valve diaphragm assemblies 448 and 442, through port 412, down diptube 414, where it bubbles through the fill of liquid chemical contained in container 400 to be removed as a vapor through T-shaped orifice 416, port 410 block diaphragm valve assembly 418, the conduit containing low dead space connector 432, block diaphragm valve assembly 422 and conduit 420.

In either case, the tandem block diaphragm valve assemblies 418, 422, 442 and 448 with the low wetted surface area conduits and their attendant low dead space connectors 444 and 432 allow disconnection of the container 400 from the rest of the manifold at the connectors 432 and 444 in significantly less time than historically would be required for low vapor pressure chemical service.

The manifold for container 400 operates in the liquid out service by supplying push gas, such as inert gases such as helium, nitrogen or other nonreactive gases, through conduit 420 to block diaphragm valve assembly 422 having diaphragm valve AV5 open and diaphragm valve AV6 closed. Push gas passes through the conduit equipped with connector 432 to block valve assembly 418 having diaphragm valve AV2 closed and diaphragm valve MV1 open to allow push gas to enter port 410 and pass out of T-shaped orifice 416 to pressurize the head space above the liquid chemical level in container 400. This forces liquid chemical up and out diptube 414, through port 412 through open diaphragm valve MV3 past closed diaphragm valve AV4 through the first conduit having connector 444 into block diaphragm valve assembly 448 past closed diaphragm valve AV8 and out open diaphragm valve AV7 to dispense point 446 to a downstream vessel or reactor such as a direct liquid injection furnace for semiconductor manufacture of electronic devices.

The manifold for container 400 can be operated in reverse to provide vapor chemical out by merely reversing the administration of push gas through conduit 446 through the same valve and conduit arrangement, wherein the push gas bubbles out of diptube 414 and entrains liquid chemical in a vapor stream which then flow out of T-shaped orifice 416 through the same status of opened and closed valves as mentioned above for assemblies 418 and 422, but with the vapor chemical being dispensed through conduit 420.

Because this manifold arrangement can be used in either liquid chemical out or vapor chemical out, with either array of block valves possibly having wetted surface contact with the low vapor pressure, high purity chemical, it is appropriate to have vacuum, purge gas, venting and even solvent flush available to both sides of the manifold represented by assembly 418 and adjacent assemblies and assembly 442 and adjacent assemblies.

The manifold associated with port 412 can be cleaned by opening valve MV3, closing valve AV4, closing valve AV7, opening valve AV8, closing valve AV12, opening valve AV13, closing valve AV17 and opening valve AV16 in block diaphragm valve assembly 456 to use high pressure purge gas source 454 to push liquid chemical back down into container 400 via port 412 and diptube 414. Then, purge gas source 454 remains on at high pressure for several minutes to remove nearly all chemical residue. Another option is to close valve MV3 and open AV4 to push residual chemical out conduit 434 check valve 438 and vent 440. Then keep purge gas source 454 on at high pressure for several minutes to remove nearly all chemical residue. Next valve AV4 is closed and AV16 is closed and valve AV12 in block diaphragm valve assembly 452 is opened to subject the wetted surface area of the manifold to vacuum. Valve AV12 can be closed and valve AV4 can be opened and then solvent 458 administered to the wetted surface area of the manifold through open valve AV17, with any residual chemical and solvent (in the case when solvent is used) removed through the vent 440. Further iterations of purging and vacuum should be administered to remove the solvent (in the case when solvent is used) and establish that the wetted surface area of the manifold is clean. This is usually determined by detecting the time to get to a threshold level of vacuum in the system with the appropriate valves closed as described above for the vacuum cycle.

The wetted surface areas in the manifold associated with port 410 will require cleaning up through block diaphragm valve assembly 422 before disconnecting at connection 432. Valve AV2 is closed and valve AV15 is closed and valve AV11 is opened to subject the manifold associated with port 410 to vacuum source 424. Several cycles of purging and vacuum can be conducted for appropriate cleaning of the wetted surface area of the manifold associated with port 410. For even more thorough cleaning or removal of particularly low vapor pressure chemical, solvent can be administered by opening valves AV14, AV10, AV6 and AV2 and closing valves AV15, AV11, AV5 and MV1 to flow solvent from solvent source 431 through the manifold associated with port 410 and removing solvent and entrained chemical through vent 440. Typically, after solvent cleaning, several iterations of purging and vacuum are desired to obtain sufficient cleaning of the manifold of solvent, with operation of the valves as described above for purge and vacuum operations.

Figure 4:
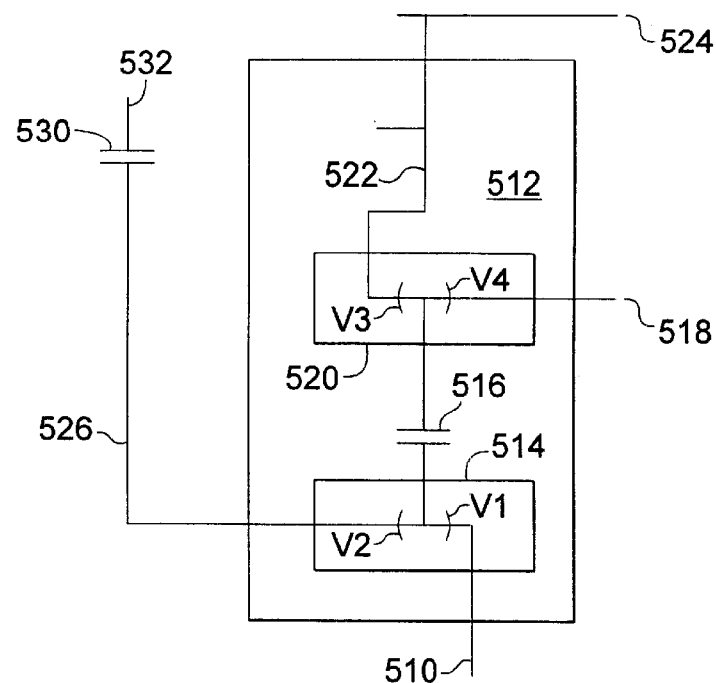
FIG. 4 is a schematic isolation view of a second embodiment of the present invention showing only one port of a container with two block diaphragm valve assemblies without vent function.

The block diaphragm valve assemblies of FIG. 4 are listed with sequence numbers for clarity in Table 1, below.

TABLE 1

| | |
|---|---|
| First block diaphragm valve assembly | Part No. 442 |
| Second block diaphragm valve assembly | Part No. 448 |
| Third block diaphragm valve assembly | Part No. 452 |
| Fourth block diaphragm valve assembly | Part No. 456 |
| Fifth block diaphragm valve assembly | Part No. 418 |
| Sixth block diaphragm valve assembly | Part No. 422 |
| Seventh block diaphragm valve assembly | Part No. 426 |
| Eighth block diaphragm valve assembly | Part No. 430 |

The diaphragm valves of FIG. 4 are listed with sequence numbers for clarity in Table 2, below.

TABLE 2

| | |
|---|---|
| First diaphragm valve | Part No. MV3 |
| Second diaphragm valve | Part No. AV4 |
| Third diaphragm valve | Part No. AV7 |
| Fourth diaphragm valve | Part No. AV8 |
| Fifth diaphragm valve | Part No. AV12 |
| Sixth diaphragm valve | Part No. AV13 |
| Seventh diaphragm valve | Part No. AV16 |
| Eighth diaphragm valve | Part No. AV17 |
| Ninth diaphragm valve | Part No. MV1 |
| Tenth diaphragm valve | Part No. AV2 |
| Eleventh diaphragm valve | Part No. AV5 |
| Twelfth diaphragm valve | Part No. AV6 |
| Thirteenth diaphragm valve | Part No. AV11 |
| Fourteenth diaphragm valve | Part No. AV10 |
| Fifteenth diaphragm valve | Part No. AV14 |
| Sixteenth diaphragm valve | Part No. AV15 |

Figure 2A:
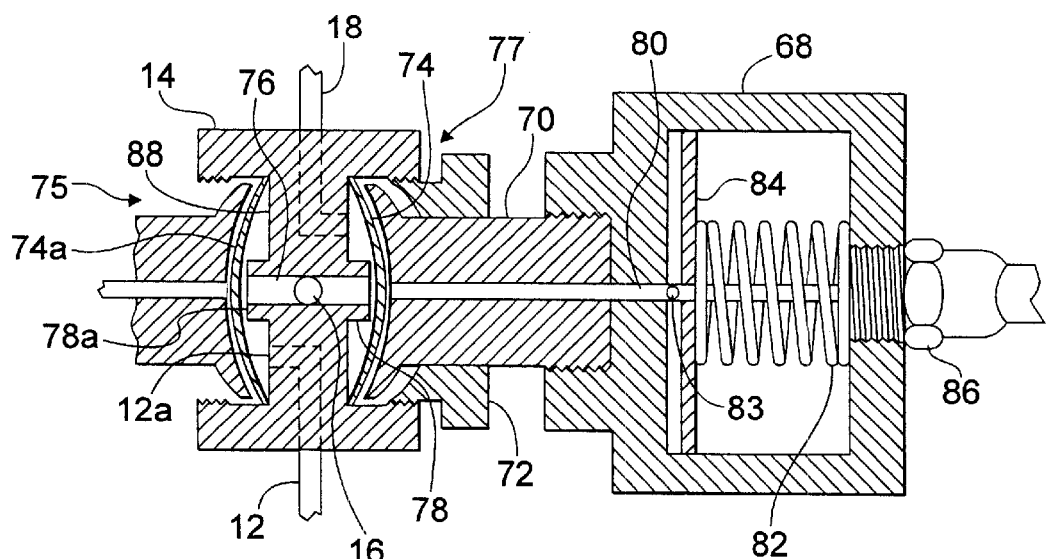
FIG. 2a is a partial cross-section of a block valve assembly with two diaphragm valves as used in each embodiment of the present invention.

FIG. 2*a* shows greater detail of first block diaphragm valve assembly 14, which is the same valve structure as second block diaphragm valve assembly 20 (which is not shown separately in detail for that reason). FIG. 2*a* is a partial cross-section of first block diaphragm valve assembly 14 showing liquid low vapor pressure, high purity chemical or second conduit 12 in flow communication with first diaphragm valve 75 comprising diaphragm 74*a* comprising a flexible metal disk with a convex side and a concave side comprising the valve seat side of the valve and valve seat 78a, as well as an actuator similar to that shown for valve 77. Conduit 12 communicates with valve 75 through aperture 12a. The diaphragm side of the diaphragm comprises the cross-sectional triangular area between the concave surface of the diaphragm 74a, the floor of core 88 and the surface of valve seat 78a in the closed condition. Valve seat 78a engages the concave side of the diaphragm 74a and allows liquid low vapor pressure, high purity TDMAT to pass through the valve when the diaphragm disengages the valve seat 78a, to the short channel 76 to conduit 16 which connects with the second block valve assembly 20 and ultimately the dispense of chemical at dispense point 110. Diaphragm 74a is actuated by any means, such as manual actuator, electric solenoid, hydraulic pressure actuation or preferably as illustrated, a pneumatic actuator, illustrated for the other diaphragm valve of block diaphragm valve assembly 14.

Purge gas and possibly pressurization gas are provided to first conduit 16 by way of conduit 18 and a second diaphragm valve 77 comprising diaphragm 74, valve seat 78, actuator connector 70, actuator armature 80, pneumatic actuator 68, bias spring 82, bellows or piston 84, which translates pneumatic pressure to valve actuation through armature 80 and pneumatic source 86. Pneumatic gas is supplied to bellows 84 by source 86 and a coaxial channel in armature 80 which communicates with bellows 84 through aperture 83. Pneumatic actuator is engaged to the diaphragm by locking nut 72. Second diaphragm valve 77 has a diaphragm side of its diaphragm 74 and a valve seat side, just as diaphragm valve 75. Valve 75 has a similar actuator structure as illustrated for valve 77.

The valve seat side of the diaphragm valves of the present invention have very little dead space or volume where a low vapor pressure liquid chemical can be retained. In addition, diaphragm valves 75 and 77 are juxtaposed to one another at their valve seat sides and connect to the conduit 16 via the very short channel 76 bored out of the monoblock of the block diaphragm valve assembly 14 base. Due to this advantageous arrangement of these two valves, it is possible to clean first conduit 16 by application of sequenced pressurizing gas and vacuum, without the need for additional means, such as solvents. Cleanout can be accomplished in a short interval, such as several minutes of sequenced pressurized gas and vacuum, in contrast to prior art systems which take several hours to several days to reach the prescribed level of residual chemical in the conduits prior to detachment of the conduits for maintenance or changeout of the container 10.

The valve seat side of the diaphragm valves comprises that portion of the valve in direct communication with the common conduit, such as 16, by way of the short channel, such as 76, and up to the sealing surface of the valve seat with the concave surface of the diaphragm when the valve is closed. The diaphragm side of the diaphragm valves comprises the other side of the sealing surface of the valve seat in communication with the aperture, such as 12a, and still under the concave side of the diaphragm. The diaphragm side of the diaphragm valve can be seen to constitute an annular, generally V-shaped cross-sectional space, which can potentially become wetted with chemical and constitute a difficult area to effectively and quickly clean of such chemical. Therefore, the present invention, by having the common conduit or first conduit 16 communicate directly with the valve seat side of the diaphragm valves of the first block valve assembly and by having the diaphragm valves juxtaposed to one another through a very short connection or channel 76, affords a low dead space valve arrangement, which can be readily cleaned by application of sequenced, repeated pressurized gas and vacuum, without the use of solvent or use of extended purging.

The pneumatic actuator 68 has a source 86 of pressurized air for valve actuation. The valve 77 is a normally closed valve which is biased to the closed position by spring 82 operating on baffle 84 and actuator armature 80 which pushes against diaphragm 77 to engage the valve seat 78. Pressurized air passes through a coaxial tube through the center of spring 82 to an aperture 83 in the actuator armature 80, which is on the opposite side of baffle 84 from the spring 82. The air pressure acts against the baffle and spring to bias the diaphragm 77 open via the armature 80 and allow chemical to flow through the valve. This represents only one of several ways a pneumatic actuator operates and the operation of the pneumatic actuator is not an aspect of the present invention. Any of the known methods and apparatus for actuating using pneumatics can be contemplated, and in fact non-pneumatic actuation can be used, such as manual or solenoid actuation. Valve 75 is similarly equipped with valve actuation equipment, not illustrated, similar to 68, 70, 72 and 86.

Figure 2B:
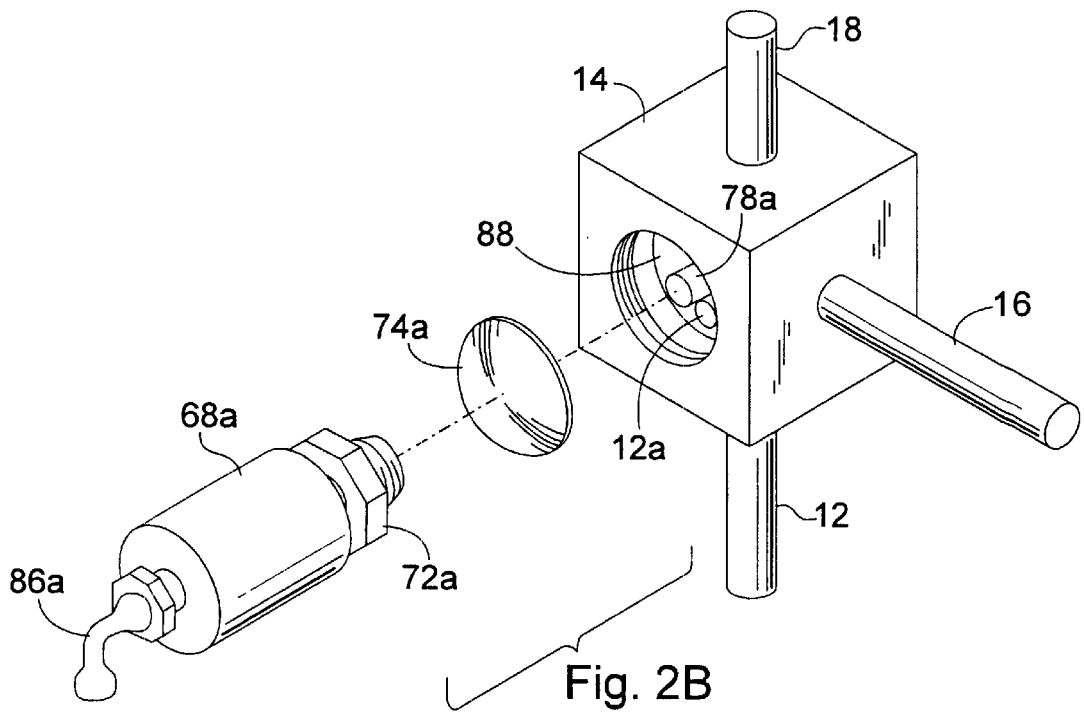
FIG. 2b is an isometric exploded view of the block diaphragm valve assembly of FIG. 2a showing the diaphragm and the pneumatic actuator removed from the block.

FIG. 2b shows an exploded perspective view of the block diaphragm valve assembly of FIG. 2a, this time showing the pneumatic actuator 68a for valve 75. The diaphragm valves' locations, illustrated for one valve as core 88, are bored out of a single monoblock of material, such as ceramics, plastics such as Teflon, or other suitable materials, but preferably is metal, such as electropolished stainless steel. Aperture 12a of second conduit 12 is illustrated to show the diaphragm side connection of the conduits in the valve. Valve seat 78a delineates the valve seat side of the sealing surface of the valve seat 78a and the diaphragm 74a, shown removed from its core location 88. Pneumatic actuator 68a is shown with its pneumatic gas source connection 86a. Chemical source or second conduit 12, pressurizing gas/purge gas source, or third conduit 18 and common or first conduit 16 to the chemical dispense are shown, respectively, emanating from the monoblock of block diaphragm valve assembly 14.

Second block diaphragm valve assembly 20 is similar to first block valve assembly 14 as illustrated in FIG. 2a, with conduit 16 in this instance with regard to second block valve assembly 20 corresponding to the structure shown for first conduit 16, conduit 112 corresponding to the structure shown for second conduit 12, and conduit 110 corresponding to the structure shown for third conduit 18, as it relates to first block diaphragm valve assembly.

Figure 3:
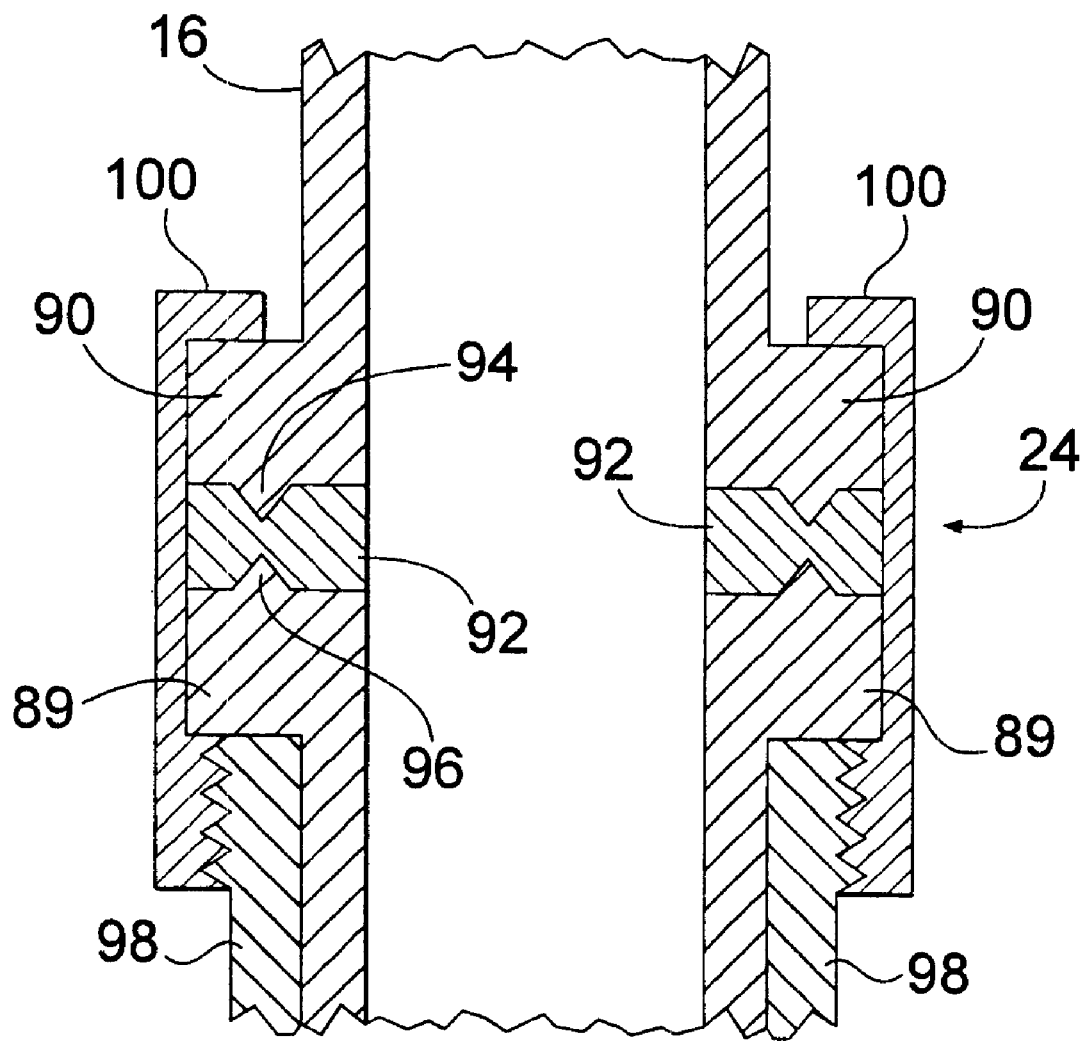
FIG. 3 is a partial cross-section view of the low dead space connector used in the first conduit of the present invention.

First low dead space connection 24 is illustrated in FIG. 3. Sealing surface 90 of first conduit 16 ends with an annular knife edge 94 depending axially from the sealing surface in the direction of the sealing surface 89 of the conduit 16, which also has an annular knife edge 96 depending axially from its sealing surface. These knife edges 94 and 96 engage an annular sealing gasket 92, which is preferably a relatively soft metal to form a low dead space connection with a superior seal. Compression fitting 100 threadably engages ring 98 to force the respective knife edges into sealing engagement with the annular soft metal gasket 92.

FIGS. 4–7 show isolated portions of the manifold for operating a low vapor pressure, high purity chemical container with at least two ports. For purposes of ease of discussion, only that portion of the manifold which may be subject to having chemical wetted surfaces is described, but it will be appreciated that a second port of the container will have appropriate manifolding also.

With reference to FIG. 4, chemical from a container not shown is removed through port 510 through first diaphragm valve V1 in first block diaphragm valve assembly 514, passing by closed second diaphragm valve V2 and through a first conduit having a low dead space connection 516 similar to the structure shown in FIG. 3, such first conduit having a first end adjacent assembly 514 and a second end adjacent assembly 520. The chemical passes through second diaphragm valve assembly 520 past closed third diaphragm valve V3 and passing out of open fourth diaphragm valve V4 to a conduit 518 dispensing the chemical to a point of use or storage.

To clean the wetted surface areas to disconnect the container at connection 516, third diaphragm valve V3 is opened, fourth diaphragm valve V4 is closed, and purge gas from source 524 passing through conduit 522 pushes residual chemical back down into the container through port 510. Next, first diaphragm valve V1 is closed and second diaphragm valve V2 is opened to remove any further chemical out conduit 526, and connection 530 to vent through a source of vacuum 532. Purge gas from source 524 remains open for several minutes at high pressure and chemical residue can be removed by either opening V2 or V1. Then, third diaphragm valve V3 is closed and the wetted surface area of the manifold is subjected to vacuum by source 532. Several quick cycles of purge and vacuum are typically required to achieve appropriate levels of cleaning, generally determined by timing the time it takes to achieve the set vacuum level from initiation of vacuum to the wetted surface area of the manifold. Typical total time required to purge clean the wetted surface is much less than 60 minutes. To facilitate removal of low vapor pressure chemicals, the several block diaphragm valve assemblies can be heated or heat traced as typically is known in the art by appropriate heating devices 512.

Figure 5:
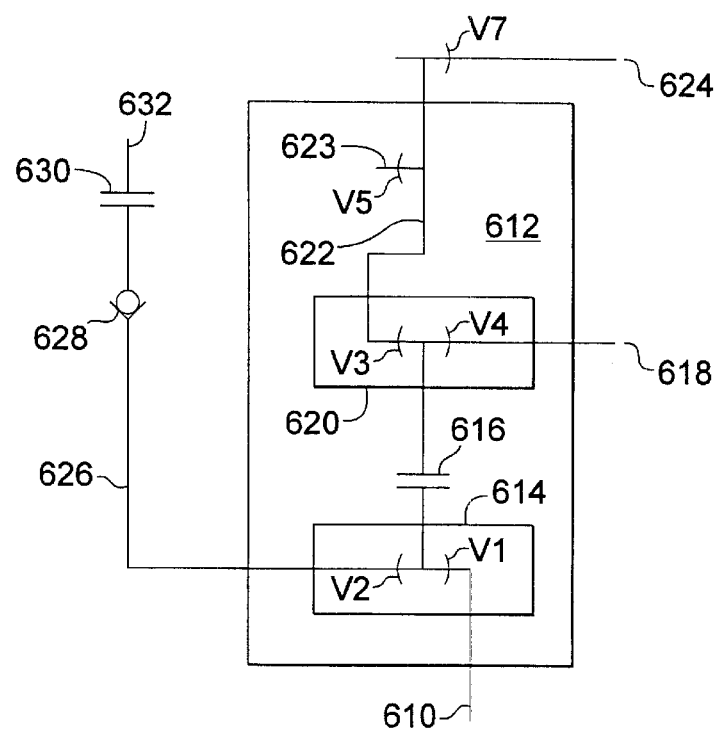
FIG. 5 is a schematic isolation view of a third embodiment of the present invention showing only one port of a container with two block diaphragm valve assemblies with vent function.

FIG. 5 shows a similar manifold for a container, not shown, wherein discrete vacuum and vent sources are provided. Chemical is removed through port 610 of the non-illustrated container. The chemical passes through open first diaphragm valve V1 of first block diaphragm valve assembly 614, passing closed second diaphragm valve V2 and through a first conduit containing a low dead space connection 616, similar to FIG. 3, such first conduit having a first end adjacent the first block diaphragm valve assembly 614 and a second end adjacent a second block diaphragm valve assembly 620. The chemical passes by closed third diaphragm valve V3 and out open fourth diaphragm valve V4 to be dispensed through a conduit 618 to storage or a downstream point of use.

To clean the wetted surface area of the manifold, diaphragm valve V4 is closed and valve V7 is opened to allow a source of purge gas 624 to pass by closed valve V5 and pass through conduit 622 and open diaphragm valve V3 to push residual chemical back through open first diaphragm valve V1 into the container via port 610. Next, diaphragm valve V1 is closed and diaphragm valve V2 is opened to allow purge gas to pass through conduit 626, check valve 628, low dead space connection 630 and out vent 632, along with any residual chemical entrained in the flowing purge gas. Purge gas from source 624 remains open for several minutes at high pressure and chemical residue can be removed by either opening V2 or V1. Vacuum is then applied to the wetted surface area of the manifold by closing diaphragm valve V2 and purge gas valve V7 and opening valve V5 to subject the flow path from diaphragm valve V1 to valve V5 to vacuum source 623. Purge gas and vacuum are alternately cycled through the wetted surface area of the manifold until it is determined that the low vapor pressure, high purity chemical has been removed to acceptable levels, usually by determining that the vacuum level is achieved in the manifold wetted surface area in an acceptable time after vacuum is administered demonstrating that further off-gasing of chemical is not occurring. Typical total time required to purge clean the wetted surface is much less than 60 minutes. To further assist in removal of low vapor pressure, high purity chemical from the wetted surface areas of the manifold, the block diaphragm valve assemblies can be heated by appropriate heat tracing or a heated compartment, as well known in the industry, as depicted at 612.

Figure 6:
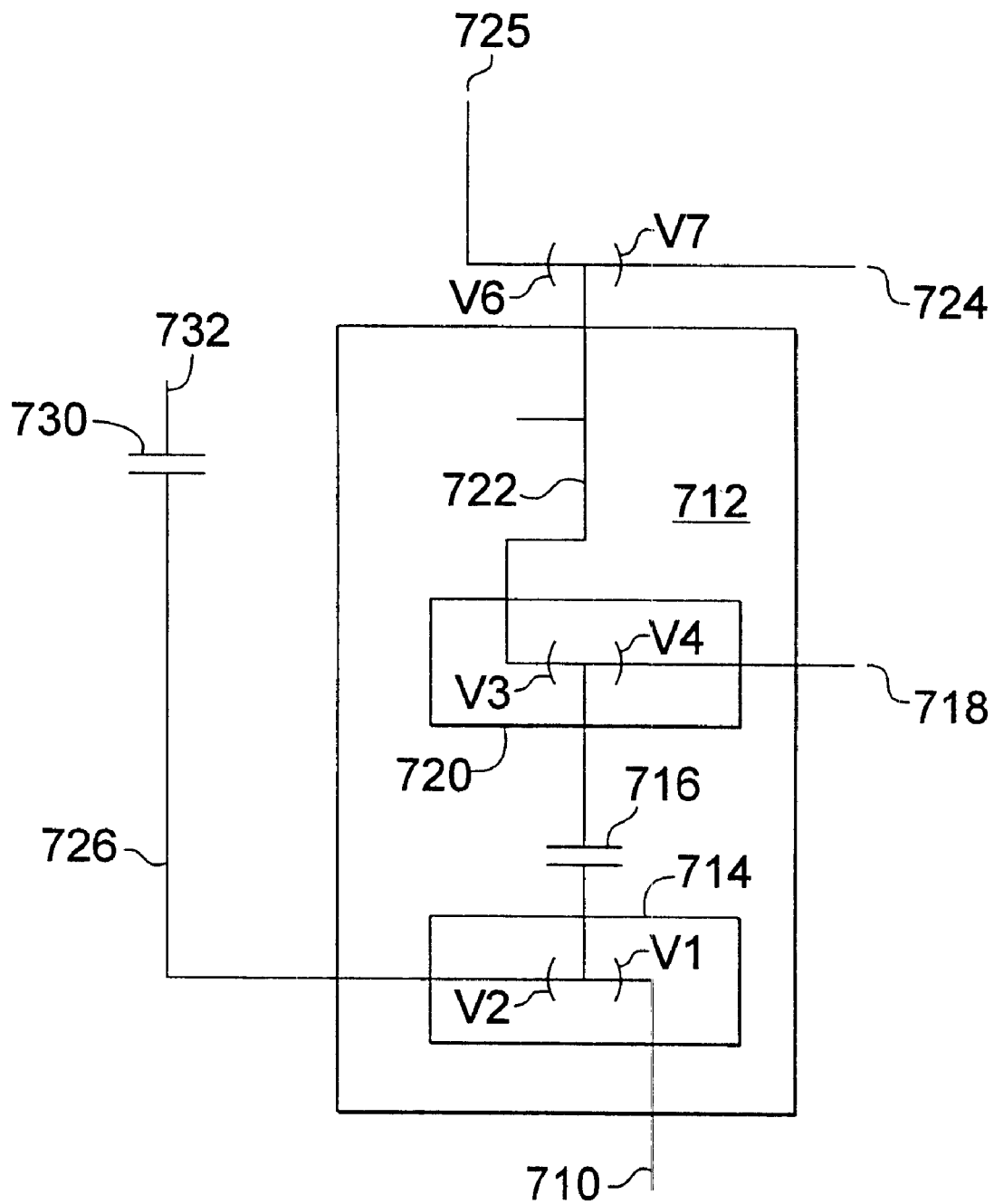
FIG. 6 is a schematic isolation view of a fourth embodiment of the present invention showing only one port of a container with two block diaphragm valve assemblies with a solvent function but without vent function.

With reference to FIG. 6, another embodiment of the present invention is illustrated. The manifold for a container, not shown, runs from port 710 to fourth diaphragm valve V4 controlling the liquid chemical dispense conduit 718. The manifold is serviced by vacuum conduit 726 and the solvent/purge conduit 722 and attendant apparatus. Chemical is removed from the non-illustrated container through port 710 through open first diaphragm valve V1 in first block diaphragm valve assembly 714. The chemical passes closed second diaphragm valve V2 and a first conduit between first diaphragm valve assembly 714 and second block diaphragm valve assembly 720, which first conduit is sectioned by low dead space connection 716, comparable to FIG. 3, into a first end adjacent assembly 714 and a second end adjacent assembly 720. Liquid chemical passes by closed third diaphragm valve V3 and out open fourth diaphragm valve V4 to a conduit 718 dispensing the chemical to storage or a point of use. The chemical is dispensed by push gas pressure applied against the headspace of the chemical in the container by manifolding connected to the container at a second port.

To clean the wetted surface area of the manifold, fourth diaphragm valve V4 is closed, the push gas is discontinued from flowing and valve V7 is opened to allow purge gas from conduit 724 to push residual chemical in the manifold's wetted surface area back into the container through port 710. Next, first diaphragm valve V1 is closed and second diaphragm valve V2 is opened to allow the purge gas to discharge any remaining chemical through conduit 726 and low dead space connection 730 to vacuum source 732. Purge gas from source 724 remains open for several minutes at high pressure and chemical residue can be removed by either opening V2 or V1. Purge gas and vacuum can be applied alternately and simultaneously by appropriate opening and closing of valve V7. After several cycles of purge and vacuum, if residual chemical remains in the wetted surface area of the manifold, then solvent is administered to the wetted surface area of the manifold by closing valve V7, opening valve V6 and keeping valve V2 open to flush the wetted surface area of the manifold with solvent for the residual chemical from solvent source 725. Solvent and chemical are also disposed of through vent/vacuum source 732, which may include appropriate abatement, not illustrated. After solvent flush, the manifold is further subjected to several cycles of purge gas and vacuum. When all chemical is removed, the manifold can be safely disconnected at low dead space connections 730 and 716 to replace the container or service any part of the overall manifold. To further assist in removal of low vapor pressure, high purity chemical from the wetted surface areas of the manifold, the block diaphragm valve assemblies can be heated by appropriate heat tracing or a heated compartment, as well known in the industry, as depicted at 712.

Figure 7:
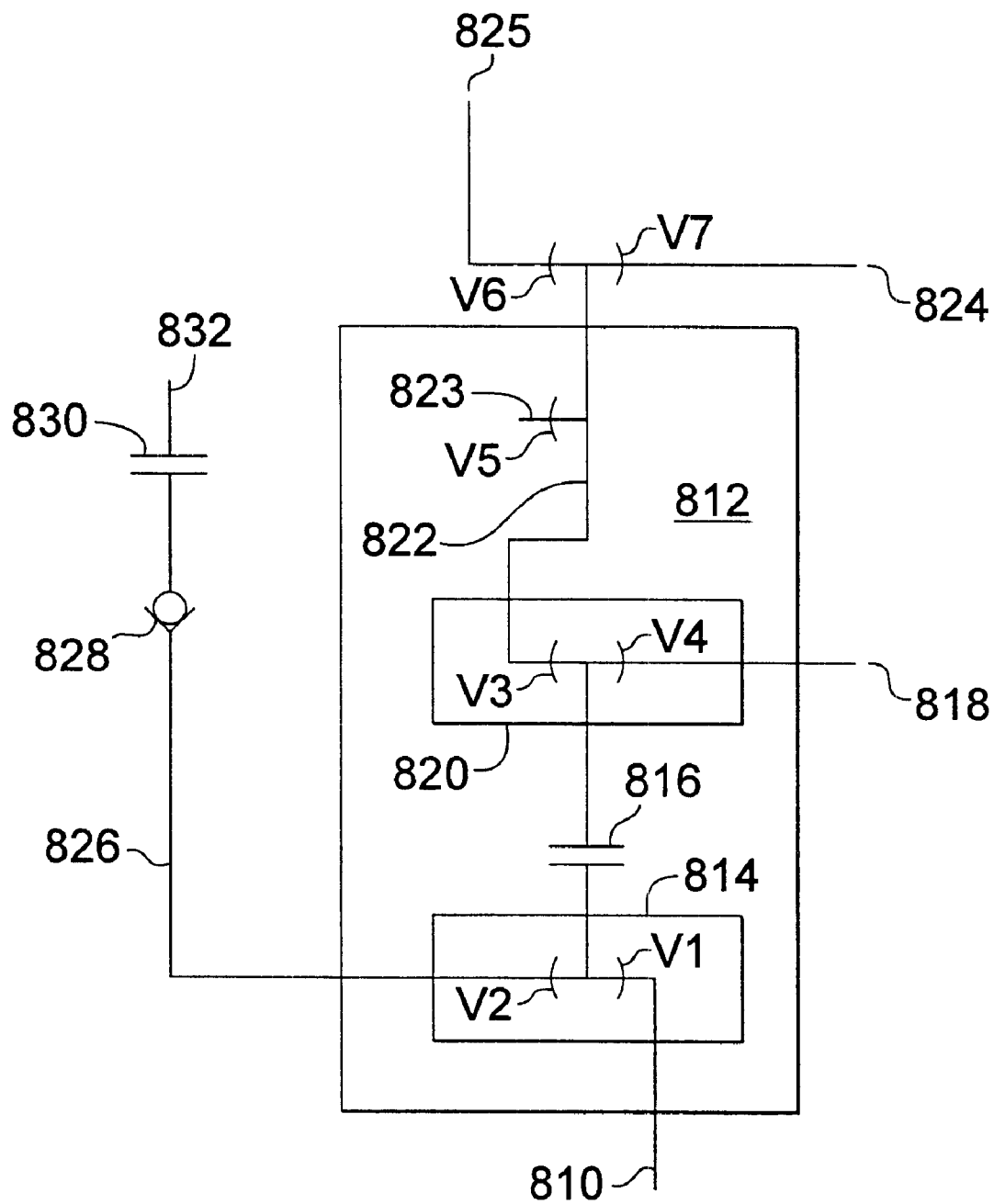
FIG. 7 is a schematic isolation view of a fifth embodiment of the present invention showing only one port of a container with two block diaphragm valve assemblies with a solvent function and with vent function.

FIG. 7 shows yet another manifold design for a low vapor pressure, high purity chemical container, not illustrated.

Liquid chemical is forced out of the container by a push gas such as illustrated in FIG. 1, through container port 810, passing through open first diaphragm valve V1 in first block diaphragm valve assembly 814 passed closed second diaphragm valve V2 and through a first conduit connecting assembly 814 and second block diaphragm valve assembly 820. The first conduit is divided into a first end adjacent the assembly 814 and a second end adjacent the assembly 820 by a low dead space connection 816, such as that illustrated in FIG. 3. The liquid chemical passes closed third diaphragm valve V3 and exits through open fourth diaphragm valve V4 to dispense conduit 818 to deliver the chemical to storage or a point of use, such as a CVD furnace.

When it is desired to discontinue chemical dispense and remove the container from the manifold for replacement or service, fourth diaphragm valve V4 is closed and third diaphragm valve V3 and valve V7 are opened to introduce purge gas from conduit 824 into the wetted surface area of the manifold to force the residual chemical back into the container through port 810. Then first diaphragm valve V1 is closed and second diaphragm valve V2 is opened to force any remaining chemical through vent conduit 826, check valve 828, low dead space connection 830 and out vent conduit 832 to appropriate abatement or containment. Purge gas from source 824 remains open for several minutes at high pressure and chemical residue can be removed by either opening V2 or V1. Valve V7 is then closed and valve V2 is closed, while vacuum valve V5 is opened to subject the wetted surface area of the manifold to vacuum source 823 to further remove any residual chemical. This purging and vacuum treatment would typically be performed through a number of cycles. If the chemical is difficult to remove, valve V5 can be closed and solvent can be administered through solvent conduit 825 and open valve V6, wherein the solvent entrains residual chemical in the wetted surface area of the manifold and exits through open valve V2 to vent through vent conduit 832. After solvent treatment, further cycles of purge gas and vacuum would typically be administered to clear and clean the line of residual solvent. Then, all valves are closed, except for a trickle flow of purge gas from valve V7, while the first conduit is broken at the low dead space connection 816 and the vent conduit is broken at low dead space connection 830 to replace the container or conduct service without concern for chemical contamination, corrosion with atmospheric components or production of deleterious by-products. To further assist in removal of low vapor pressure, high purity chemical from the wetted surface areas of the manifold, the block diaphragm valve assemblies can be heated by appropriate heat tracing or a heated compartment, as well known in the industry, as depicted at 812.

Although the apparatus of FIGS. 4–7 have been shown in partial schematic without illustrating the container or the other container port or manifold, it is understood that the apparatus of FIGS. 4–7 contemplates further manifolding as depicted for FIG. 1. Specifically, liquid chemical is forced out of a container through a diptube 510, 610, 710 or 810 by a push gas administered as in FIG. 1. However, it is also contemplated for the apparatus of FIGS. 4–7 that push gas can be introduced through fourth diaphragm valve V4 of the second block diaphragm valve assembly for each of FIGS. 4–7 to bubble into the non-illustrated container and remove vapor comprising push gas entrained with chemical out a second port and manifold configured in accordance with that illustrated in FIG. 1 for the righthand side manifold.

In FIGS. 1 and 4–7 the diaphragm valves are illustrated with a cresent or meniscus depiction to indicate the arrangement of the diaphragm itself with its diaphragm side and its valve seat side in accordance with the depiction of that orientation in FIG. 2a. Therefore, the concavity of the diaphragm valves in FIGS. 1 and 4–7 represents the valve seat side of the diaphragm valve having a low dead space and minimum wetted surface area and the convex side of the diaphragm valves in FIGS. 1 and 4–7 represents the diaphragm side of the diaphragm valve which has greater potential dead space and more potential wetted surface area, as described with regard to FIG. 2a above.

The present invention provides unique and unexpected improvement over the prior art in low vapor pressure, high purity chemical distribution from a container of the chemical by using a combination of two block diaphragm valve assemblies connected by a low dead space connection wherein the diaphragm valves have their valve seat sides facing one another in the block valve assemblies to provide a minimal wetted surface area for decontamination of the chemical at such times as container changeout or servicing. Clean out using the apparatus of the present invention has demonstrated drydown times of less than one hour where the prior art has taken days. This allows electronic device fabricators to minimize down time for change outs or service and to maximize utilization of the expensive equipment designed to produce electronic devices in fabs easily costing over $1 billion per plant to construct and operate.

The present invention has been set forth with regard to several preferred embodiments, but the full scope of the present invention should be ascertained from the claims below.

What is claimed is:

1. A purgeable manifold for transfer of low vapor pressure, high purity chemicals in a high purity chemical delivery system, comprising:

(a) a first container for containing a quantity of said low vapor pressure, high purity chemical having at least two ports capable of receiving or dispensing said low vapor pressure, high purity chemical;

(b) a first conduit for detachably connecting said first container to a point of source or dispense of said low vapor pressure, high purity chemical, said first conduit having a first end and a second end and a first low dead space connector for detaching said first end of said first conduit from said second end of said first conduit;

(c) a first block diaphragm valve assembly having first and second diaphragm valves, each diaphragm valve having a diaphragm and having a valve seat side and a diaphragm side, wherein the valve seat side of each diaphragm valve is juxtaposed to the other valve seat side of the other diaphragm valve, and each valve seat side of each diaphragm valve having low vapor pressure, high purity chemical flow communication with said first end of said first conduit, and said diaphragm side of said first diaphragm valve having flow communication with a first of said at least two ports, and said diaphragm side of said second diaphragm valve having flow communication with a conduit capable of a function selected from the group consisting of a source of push gas, a source of purge gas and a source of vent;

(d) a second block diaphragm valve assembly having third and fourth diaphragm valves, each diaphragm valve having a diaphragm and having a valve seat side and a diaphragm side, wherein the valve seat side of each diaphragm valve is juxtaposed to the other valve seat side of the other diaphragm valve, and each valve seat side of each diaphragm valve having flow communication with said second end of said first conduit, and said diaphragm side of said third diaphragm valve having flow communication with a conduit capable of a function selected from the group consisting of a source of purge gas and a source of vacuum, and said diaphragm side of said fourth diaphragm valve having flow communication with a conduit capable of a function selected from the group consisting of a source of push gas, a source of bubbling gas and a dispense for low vapor pressure, high purity chemical; and (e) said second port having flow communication with said first container and capable of a function selected from the group consisting of delivering push gas to said first container and dispensing low vapor pressure, high purity chemical in a push gas from said first container.

2. The manifold of claim 1 wherein said diaphragm side of said second diaphragm valve has flow communication with a conduit for a source of high pressure purge gas that is used to purge residual low volatility chemical from the wetted surface to vent or vacuum via the container port or vent port.

3. The manifold of claim 2 wherein said diaphragm side of said third diaphragm valve has flow communication with a conduit for a source of vacuum.

4. The manifold of claim 3 wherein said diaphragm side of said fourth diaphragm valve has flow communication with a conduit for dispense of low vapor pressure, high purity chemical.

5. The manifold of claim 1 wherein said diaphragm side of said second diaphragm valve has flow communication with a conduit for a source of vent and vacuum.

6. The manifold of claim 5 wherein said diaphragm side of said third diaphragm valve has flow communication with a conduit for purge gas.

7. The manifold of claim 1 wherein said diaphragm side of said second diaphragm valve has flow communication with a conduit for a source of vent.

8. The manifold of claim 7 wherein said diaphragm side of said third diaphragm valve has flow communication with a conduit for purge gas and vacuum.

9. The manifold of claim 8 wherein said diaphragm side of said third diaphragm valve has flow communication with a valve in flow communication with a source of vacuum and a valve in flow communication with a source of purge gas.

10. The manifold of claim 1 wherein said diaphragm side of said third diaphragm valve has flow communication with a valve in flow communication with a source of solvent and a valve in flow communication with a source of purge gas.

11. The manifold of claim 1 wherein said diaphragm side of said second diaphragm valve has flow communication with a conduit for a source of vent and said diaphragm side of said third diaphragm valve has flow communication with a valve in flow communication with a source of solvent, a valve in flow communication with a source of vacuum and a valve in flow communication with a source of purge gas.

12. The manifold of claim 1 wherein said first and second block diaphragm valve assemblies have a heater.

13. A purgeable manifold for transfer of low vapor pressure, high purity chemicals in a high purity chemical delivery system, comprising:

(a) a first container for containing a quantity of said low vapor pressure, high purity chemical having at least two ports capable of receiving or dispensing said low vapor pressure, high purity chemical;

(b) a first conduit for detachably connecting said first container to a point of source or dispense of said low vapor pressure, high purity chemical, said first conduit having a first end and a second end and a first low dead space connector for detaching said first end of said first conduit from said second end of said first conduit;

(c) a first block diaphragm valve assembly having first and second diaphragm valves, each diaphragm valve having a diaphragm and having a valve seat side and a diaphragm side, wherein the valve seat side of each diaphragm valve is juxtaposed to the other valve seat side of the other diaphragm valve, and each valve seat side of each diaphragm valve having low vapor pressure, high purity chemical flow communication with said first end of said first conduit, and said diaphragm side of said first diaphragm valve having flow communication with a first of said at least two ports, and said diaphragm side of said second diaphragm valve having flow communication with a second conduit in flow communication with a source of vent and vacuum, said second conduit having a second low dead space connector for disconnecting a first and second end of said second conduit;

(d) a second block diaphragm valve assembly having third and fourth diaphragm valves, each diaphragm valve having a diaphragm and having a valve seat side and a diaphragm side, wherein the valve seat side of each diaphragm valve is juxtaposed to the other valve seat side of the other diaphragm valve, and each valve seat side of each diaphragm valve having flow communication with said second end of said first conduit, and said diaphragm side of said third diaphragm valve having flow communication with a source of purge gas, and said diaphragm side of said fourth diaphragm valve having flow communication with a dispense for low vapor pressure, high purity chemical; and (e) said second port having flow communication with said first container and capable of delivering push gas to said first container.

14. The manifold of claim 13 wherein said first and second block diaphragm valve assemblies have a heater.

15. A purgeable manifold for transfer of low vapor pressure, high purity chemicals in a high purity chemical delivery system, comprising:

(a) a first container for containing a quantity of said low vapor pressure, high purity chemical having at least two ports capable of receiving or dispensing said low vapor pressure, high purity chemical;

(b) a first conduit for detachably connecting said first container to a point of source or dispense of said low vapor pressure, high purity chemical, said first conduit having a first end and a second end and a first low dead space connector for detaching said first end of said first conduit from said second end of said first conduit;

(c) a first block diaphragm valve assembly having first and second diaphragm valves, each diaphragm valve having a diaphragm and having a valve seat side and a diaphragm side, wherein the valve seat side of each diaphragm valve is juxtaposed to the other valve seat side of the other diaphragm valve, and each valve seat side of each diaphragm valve having low vapor pressure, high purity chemical flow communication with said first end of said first conduit, and said diaphragm side of said first diaphragm valve having flow communication with a first of said at least two ports, and said diaphragm side of said second diaphragm valve having flow communication with a second conduit in flow communication with a source of vent, said second conduit having a second low dead space connector for disconnecting a first and second end of said second conduit;

(d) a second block diaphragm valve assembly having third and fourth diaphragm valves, each diaphragm valve having a diaphragm and having a valve seat side and a diaphragm side, wherein the valve seat side of each diaphragm valve is juxtaposed to the other valve seat side of the other diaphragm valve, and each valve seat side of each diaphragm valve having flow communication with said second end of said first conduit, and said diaphragm side of said third diaphragm valve having flow communication with a source of purge gas and a source of vacuum, and said diaphragm side of said fourth diaphragm valve having flow communication with a dispense for low vapor pressure, high purity chemical; and (e) said second port having flow communication with said first container and capable of delivering push gas to said first container.

16. The manifold of claim 15 wherein said first and second block diaphragm valve assemblies have a heater.

17. A purgeable manifold for transfer of low vapor pressure, high purity chemicals in a high purity chemical delivery system, comprising:

(a) a first container for containing a quantity of said low vapor pressure, high purity chemical having at least two ports capable of receiving or dispensing said low vapor pressure, high purity chemical;

(b) a first conduit for detachably connecting said first container to a point of source or dispense of said low vapor pressure, high purity chemical, said first conduit having a first end and a second end and a first low dead space connector for detaching said first end of said first conduit from said second end of said first conduit;

(c) a first block diaphragm valve assembly having first and second diaphragm valves, each diaphragm valve having a diaphragm and having a valve seat side and a diaphragm side, wherein the valve seat side of each diaphragm valve is juxtaposed to the other valve seat side of the other diaphragm valve, and each valve seat side of each diaphragm valve having low vapor pressure, high purity chemical flow communication with said first end of said first conduit, and said diaphragm side of said first diaphragm valve having flow communication with a first of said at least two ports, and said diaphragm side of said second diaphragm valve having flow communication with a second conduit in flow communication with a source of vent and vacuum, said second conduit having a second low dead space connector for disconnecting a first and second end of said second conduit;

(d) a second block diaphragm valve assembly having third and fourth diaphragm valves, each diaphragm valve having a diaphragm and having a valve seat side and a diaphragm side, wherein the valve seat side of each diaphragm valve is juxtaposed to the other valve seat side of the other diaphragm valve, and each valve seat side of each diaphragm valve having flow communication with said second end of said first conduit, and said diaphragm side of said third diaphragm valve having flow communication with a source of purge gas and a source of solvent, and said diaphragm side of said fourth diaphragm valve having flow communication with a dispense for low vapor pressure, high purity chemical; and (e) said second port having flow communication with said first container and capable of delivering push gas to said first container.

18. The manifold of claim 17 wherein said first and second block diaphragm valve assemblies have a heater.

19. A purgeable manifold for transfer of low vapor pressure, high purity chemicals in a high purity chemical delivery system, comprising:

(a) a first container for containing a quantity of said low vapor pressure, high purity chemical having at least two ports capable of receiving or dispensing said low vapor pressure, high purity chemical;

(b) a first conduit for detachably connecting said first container to a point of source or dispense of said low vapor pressure, high purity chemical, said first conduit having a first end and a second end and a first low dead space connector for detaching said first end of said first conduit from said second end of said first conduit;

(c) a first block diaphragm valve assembly having first and second diaphragm valves, each diaphragm valve having a diaphragm and having a valve seat side and a diaphragm side, wherein the valve seat side of each diaphragm valve is juxtaposed to the other valve seat side of the other diaphragm valve, and each valve seat side of each diaphragm valve having low vapor pressure, high purity chemical flow communication with said first end of said first conduit, and said diaphragm side of said first diaphragm valve having flow communication with a first of said at least two ports, and said diaphragm side of said second diaphragm valve having flow communication with a second conduit in flow communication with a source of vent, said second conduit having a second low dead space connector for disconnecting a first and second end of said second conduit;

(d) a second block diaphragm valve assembly having third and fourth diaphragm valves, each diaphragm valve having a diaphragm and having a valve seat side and a diaphragm side, wherein the valve seat side of each diaphragm valve is juxtaposed to the other valve seat side of the other diaphragm valve, and each valve seat side of each diaphragm valve having flow communication with said second end of said first conduit, and said diaphragm side of said third diaphragm valve having flow communication with a source of purge gas, a source of solvent and a source of vacuum, and said diaphragm side of said fourth diaphragm valve having flow communication with a dispense for low vapor pressure, high purity chemical; and (e) said second port having flow communication with said first container and capable of delivering push gas to said first container.

20. The manifold of claim 19 wherein said first and second block diaphragm valve assemblies have a heater.

21. A purgeable manifold for transfer of low vapor pressure, high purity chemicals in a high purity chemical delivery system, comprising:

(a) a first container for containing a quantity of said low vapor pressure, high purity chemical having at least two ports capable of receiving or dispensing said low vapor pressure, high purity chemical;

(b) a first conduit for detachably connecting said first container to a point of source or dispense of said low vapor pressure, high purity chemical, said first conduit having a first end and a second end and a first low dead space connector for detaching said first end of said first conduit from said second end of said first conduit;

(c) a first block diaphragm valve assembly having first and second diaphragm valves, each diaphragm valve having a diaphragm and having a valve seat side and a diaphragm side, wherein the valve seat side of each diaphragm valve is juxtaposed to the other valve seat side of the other diaphragm valve, and each valve seat side of each diaphragm valve having low vapor pressure, high purity chemical flow communication with said first end of said first conduit, and said diaphragm side of said first diaphragm valve having flow communication with a first of said at least two ports, and said diaphragm side of said second diaphragm valve having flow communication with a second conduit in flow communication with a source of vent, said second conduit having a second low dead space connector for disconnecting a first and second end of said second conduit;

(d) a second block diaphragm valve assembly having third and fourth diaphragm valves, each diaphragm valve having a diaphragm and having a valve seat side and a diaphragm side, wherein the valve seat side of each diaphragm valve is juxtaposed to the other valve seat side of the other diaphragm valve, and each valve seat side of each diaphragm valve having flow communication with said second end of said first conduit, and said diaphragm side of said third diaphragm valve having flow communication with a conduit capable of a function selected from the group consisting of dispense for low vapor pressure, high purity chemical and a source of bubbling gas, and said diaphragm side of said fourth diaphragm valve having flow communication with a source of purge gas, a source of solvent and a source of vacuum;

(e) a third block diaphragm valve assembly having fifth and sixth diaphragm valves, each diaphragm valve having a diaphragm and having a valve seat side and a diaphragm side, wherein the valve seat side of each diaphragm valve is juxtaposed to the other valve seat side of the other diaphragm valve, and each valve seat side of each diaphragm valve having flow communication with said diaphragm side of said fourth diaphragm valve, and said diaphragm side of said fifth diaphragm valve having flow communication with a source of vacuum, and said diaphragm side of said sixth diaphragm valve having flow communication with a fourth block diaphragm valve assembly;

(f) said fourth block diaphragm valve assembly having seventh and eighth diaphragm valves, each diaphragm valve having a diaphragm and having a valve seat side and a diaphragm side, wherein the valve seat side of each diaphragm valve is juxtaposed to the other valve seat side of the other diaphragm valve, and each valve seat side of each diaphragm valve having flow communication with said third block diaphragm valve assembly, and said diaphragm side of said seventh diaphragm valve having flow communication with a source of purge gas, and said diaphragm side of said eighth diaphragm valve having flow communication with a source of solvent;

(g) said second port having flow communication with said first container and a fifth block diaphragm valve assembly;

(h) said fifth block diaphragm valve assembly having ninth and tenth diaphragm valves, each diaphragm valve having a diaphragm and having a valve seat side and a diaphragm side, wherein the valve seat side of each diaphragm valve is juxtaposed to the other valve seat side of the other diaphragm valve, and each valve seat side of each diaphragm valve having low vapor pressure, high purity chemical flow communication with said first end of said first conduit, and said diaphragm side of said ninth diaphragm valve having flow communication with said second port, and said diaphragm side of said tenth diaphragm valve having flow communication with a source of vent, said second conduit having a second low dead space connector for disconnecting a first and second end of said second conduit;

(i) a sixth block diaphragm valve assembly having eleventh and twelfth diaphragm valves, each diaphragm valve having a diaphragm and having a valve seat side and a diaphragm side, wherein the valve seat side of each diaphragm valve is juxtaposed to the other valve seat side of the other diaphragm valve, and each valve seat side of each diaphragm valve having flow communication with said second end of said second conduit, and said diaphragm side of said eleventh diaphragm valve having flow communication with a conduit capable of a function selected from the group consisting of dispense for low vapor pressure, high purity chemical and a source of push gas, and said diaphragm side of said twelfth diaphragm valve having flow communication with a seventh block diaphragm valve assembly;

(j) said seventh block diaphragm valve assembly having thirteenth and fourteenth diaphragm valves, each diaphragm valve having a diaphragm and having a valve seat side and a diaphragm side, wherein the valve seat side of each diaphragm valve is juxtaposed to the other valve seat side of the other diaphragm valve, and each valve seat side of each diaphragm valve having flow communication with said diaphragm side of said twelfth diaphragm valve, and said diaphragm side of said thirteenth diaphragm valve having flow communication with a source of vacuum, and said diaphragm side of said fourteenth diaphragm valve having flow communication with a eighth block diaphragm valve assembly;

(k) said eighth block diaphragm valve assembly having fifteenth and sixteenth diaphragm valves, each diaphragm valve having a diaphragm and having a valve seat side and a diaphragm side, wherein the valve seat side of each diaphragm valve is juxtaposed to the other valve seat side of the other diaphragm valve, and each valve seat side of each diaphragm valve having flow communication with said seventh block diaphragm valve assembly, and said diaphragm side of said fifteenth diaphragm valve having flow communication with a source of solvent, and said diaphragm side of said sixteenth diaphragm valve having flow communication with a source of purge gas;

(l) a T-shaped end on said second port in said first container.

22. The manifold of claim 21 wherein said block valve assemblies include a heater.

* * * * *